US010192713B2

United States Patent
Yabata et al.

(10) Patent No.: US 10,192,713 B2
(45) Date of Patent: Jan. 29, 2019

(54) CHARGED PARTICLE BEAM DEVICE

(71) Applicant: Hitachi High-Technologies Corporation, Minato-ku, Tokyo (JP)

(72) Inventors: Kiyoshi Yabata, Tokyo (JP); Hideki Kikuchi, Tokyo (JP); Naotomo Maruyama, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 26 days.

(21) Appl. No.: 15/542,163

(22) PCT Filed: Dec. 7, 2015

(86) PCT No.: PCT/JP2015/084230
§ 371 (c)(1),
(2) Date: Jul. 7, 2017

(87) PCT Pub. No.: WO2016/114033
PCT Pub. Date: Jul. 21, 2016

(65) Prior Publication Data
US 2018/0269027 A1    Sep. 20, 2018

(30) Foreign Application Priority Data
Jan. 13, 2015   (JP) ................. 2015-003787

(51) Int. Cl.
*H01J 37/20*     (2006.01)
*H01J 37/26*     (2006.01)

(52) U.S. Cl.
CPC .............. *H01J 37/20* (2013.01); *H01J 37/26* (2013.01); *H01J 2237/0216* (2013.01); *H01J 2237/204* (2013.01); *H01J 2237/2007* (2013.01)

(58) Field of Classification Search
CPC .... H01J 37/20; H01J 37/26; H01J 2237/0216; H01J 2237/2007; H01J 2237/204
(Continued)

(56) References Cited

U.S. PATENT DOCUMENTS 5,224,174 A * 6/1993 Schneider ........... G01S 7/52061
                                                382/124
9,000,397 B1 * 4/2015 Heyoung ................ H01J 37/20
                                                250/307

(Continued)

FOREIGN PATENT DOCUMENTS

JP    56-15567 U    2/1981
JP    1-129754 U    9/1989

(Continued)

OTHER PUBLICATIONS

International Search Report (PCT/ISA/210) issued in PCT Application No. PCT/JP2015/084230 dated Mar. 15, 2016 with English-language translation (four (4) pages).

(Continued)

*Primary Examiner* — Nicole Ippolito
(74) *Attorney, Agent, or Firm* — Crowell & Moring LLP

(57) ABSTRACT

In a side entry type sample holder, vibrations in the radial direction of the sample holder provoke a resolving power decrease in the measurement results. In the present invention, the side entry type sample holder has a stepped portion in the radial direction of an axial portion. The sample stage has a support part contacting the stepped portion in a cylindrical portion capable of moving as one body in the axis direction of the sample holder, and, through the contact between the stepped portion and the support part, a frictional force is generated, opposing the radial direction of the axial portion in the sample holder. In this manner, the vibrations in the radial direction of the sample holder are suppressed, (Continued)

and the resolving power decrease in the measurement results is suppressed.

8 Claims, 8 Drawing Sheets

(58) Field of Classification Search
USPC ............... 250/440.11, 441.11, 442.11, 443.1
See application file for complete search history.

(56) References Cited

U.S. PATENT DOCUMENTS

| | | | |
|---|---|---|---|
| 9,012,841 B2* | 4/2015 | Heyoung | H01J 37/20 250/307 |
| 2010/0133448 A1 | 6/2010 | Hamochi | |
| 2011/0260558 A1* | 10/2011 | Shibahara | H01J 37/20 310/12.06 |
| 2015/0206704 A1* | 7/2015 | Momoi | G02B 21/26 250/310 |
| 2015/0243472 A1 | 8/2015 | Kikuchi et al. | |

FOREIGN PATENT DOCUMENTS

| | | |
|---|---|---|
| JP | 2010-157491 A | 7/2010 |
| JP | 2014-38786 A | 2/2014 |
| JP | 2014-89936 A | 5/2014 |

OTHER PUBLICATIONS

Japanese-language Written Opinion (PCT/ISA/237) issued in PCT Application No. PCT/JP2015/084230 dated Mar. 15, 2016 (three (3) pages).

* cited by examiner

CHARGED PARTICLE BEAM DEVICE

TECHNICAL FIELD

The present invention relates to a charged particle beam apparatus, and more particularly to a charged particle beam apparatus provided with a sample stage into which a side-entry sample holder is introduced.

BACKGROUND ART

A charged particle beam apparatus, e.g., an electron microscope typified by a transmission electron microscope (Transmission Electron Microscope, TEM) adopts a side-entry sample stage into which a sample holder is introduced in a traverse direction relative to a mirror body.

PTL 1 relates to a side-entry sample stage. PTL 1 describes a structure including: a slider tube that slides in a longitudinal direction of the sample holder and can move together with the sample holder; a touching member that contacts the slider tube and determines an setting position of the sample holder; and an elastic body arranged between the slider tube and the touching member. The structure is for reducing sample drift due to distortion of an O-ring that seals between a vacuum sample chamber and the atmosphere in a sample holder.

CITATION LIST

Patent Literature

PTL 1 : JP Patent Publication (Kokai) 2014-38786 A

SUMMARY OF INVENTION

Technical Problem

An electron microscope, e.g., a TEM, performs observation under high magnification conditions for direct observation of atoms, and there is an increasing need for high resolution. Under such observation conditions, however, a subtle displacement of a sample can greatly influence a resulting image. In particular, in the case of a side-entry sample stage, when a sample holder is introduced or moved, oscillations occur in a radial direction of the sample holder, i.e., in a direction perpendicular to a longitudinal direction (axial direction). A resulting image is deteriorated with an increase in the amplitude (displacement amplitude), rendering high-precision sample observation difficult.

With the technique disclosed in PTL 1, the sample holder is temporarily positioned by the touching member, and then the sample holder is pushed back by the spring force of the elastic body to a position that is determined as a final position of the sample holder, thereby reducing sample drift. However, there is no consideration with regard to oscillations in a radial direction of the sample holder described above.

An object of the present invention relates particularly to a reduction in displacement amplitude due to oscillations in a radial direction of a sample holder to achieve high-resolution sample observation in a side-entry sample stage.

Solution to Problem

An aspect to achieve the above object is a charged particle beam apparatus including: a sample holder configured to hold a sample; and a sample stage into which the sample holder is introduced, wherein the sample holder includes: a shaft portion configured to hold a sample base on which a sample is placed on one end portion; a step portion configured to be formed in a radial direction of the shaft portion; and an elastic body configured to be arranged in a vicinity of the step portion, the sample stage includes: a cylindrical portion configured to be capable of accommodation of a part of the shaft portion; an outer cylindrical portion configured to accommodate the cylindrical portion; and a guide portion configured to be arranged between the cylindrical portion and the outer cylindrical portion, the guide portion including a ball member configured to be capable of rotation in an axial direction of the shaft portion, the guide portion supporting the cylindrical portion in the radial direction of the shaft portion, the cylindrical portion forms a support portion configured to contact the step portion when the sample holder is inserted, and contact between the step portion and a support portion generates a frictional force in the radial direction of the shaft portion relative to the sample holder.

Advantageous Effects of Invention

The aforementioned configuration reduces displacement amplitude due to oscillations of a sample holder in a side-entry sample stage and contributes to high-resolution observation.

DESCRIPTION OF EMBODIMENTS

Figure 1:
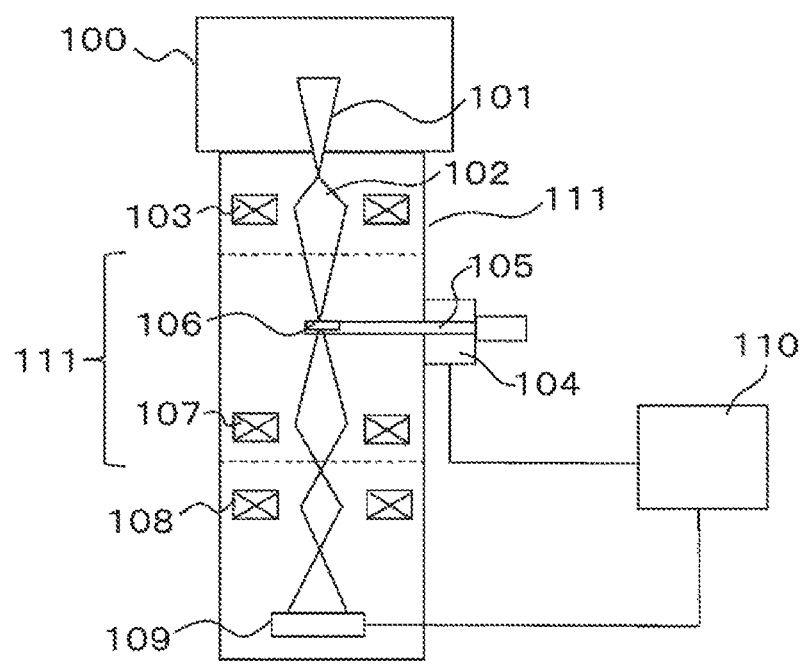
FIG. 1 is a view illustrating a basic configuration of a charged particle beam apparatus according to the present embodiment.

The present embodiments are described below in conjunction with the drawings. Like constituent parts in the drawings are designated with like reference numerals throughout, and the description may be omitted.

<Apparatus configuration>

FIG. 1 illustrates a basic configurational view of a TEM, which is an example of a charged particle beam apparatus according to the present embodiments.

A TEM body 100 is mainly comprised of an electron gun 101, an illumination lens 103, an objective lens 107, a projection lens 108, a sample chamber 111, and a detector 109, and is accommodated in a column 112. A sample 106 is attached to a sample holder 105. The sample holder 105 is introduced into the sample chamber 111 from a sample stage 104, which is provided on a side surface of the TEM body 100. The sample chamber 111 is a space indicated by the dotted lines in the drawing and is vacuum-evacuated with a vacuum pump, which is not illustrated, during sample observation so as to be maintained in a vacuum state (e.g., about $10^{-5}$ Pa). In the drawing, the sample chamber 111 is located in a space below the illumination lens 103 and above the projection lens 108, but is not limited thereto. The detector 109 is provided below the projection lens 108. In the drawing, a controller 110 is connected to each component to generally control the apparatus. However, it may be configured to include controllers that are independent of one another for the respective components.

An electron beam 102 emitted from the electron gun 101 is focused by the illumination lens 103, and the sample 106 mounted on the sample holder 105 in the sample chamber 111 is illuminated. An electron that has transmitted through the sample 106 forms an image through the objective lens 107, and the image is enlarged by the projection lens 108 and the image is projected on the detector 109. The projected image is displayed by an output device, which is not illustrated, via the controller 110.

Figure 7:
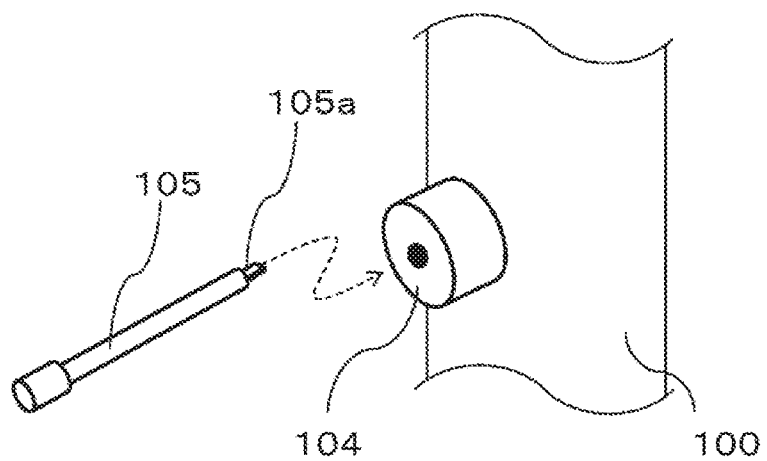
FIG. 7 is an illustrative view describing introduction of a sample holder into a sample stage according to the present embodiments.

FIG. 7 is a view describing introduction of the sample holder into the sample stage according to the present embodiments.

The sample holder 105 is inserted, from the side of a holder end portion 105a, into the sample stage 104. The sample stage 104 is provided on a side surface of the TEM body 100.

Figure 8:
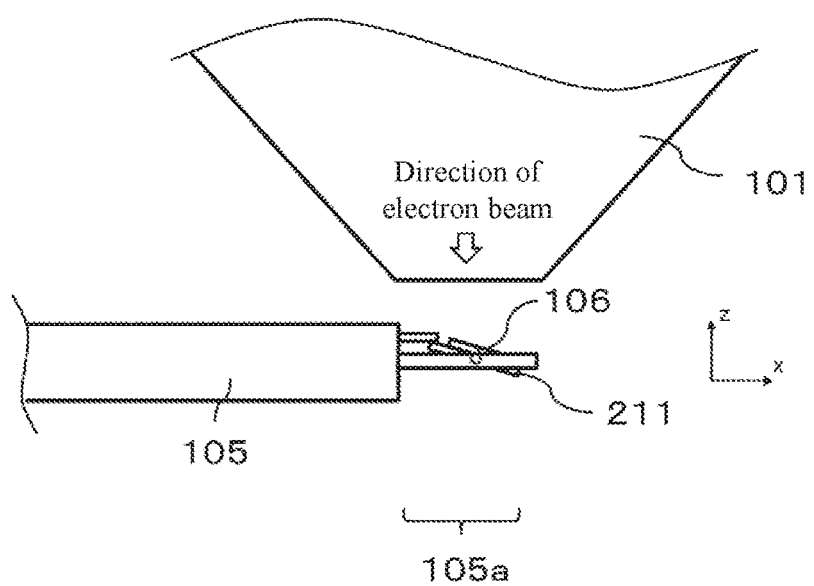
FIG. 8 is a view illustrating a basic configuration of a cross-section of a sample holder during sample observation according to the present embodiments.

FIG. 8 is a view illustrating a basic configuration of a cross-section of the sample holder during sample observation according to the present embodiments.

The sample 106 placed on a sample base 211 at the holder end portion 105a of the sample holder 105 is arranged to be located below the electron gun 101 during observation. The sample 106 is observed by an electron beam emitted from the electron gun 101. Regarding the sample holder 105, the sample base 211 can be inclined with a sample inclination mechanism, which is not illustrated, so that the sample 106 can be observed at any angle.

First Embodiment

<Configuration and operation of the sample stage and the sample holder>

Figure 2:
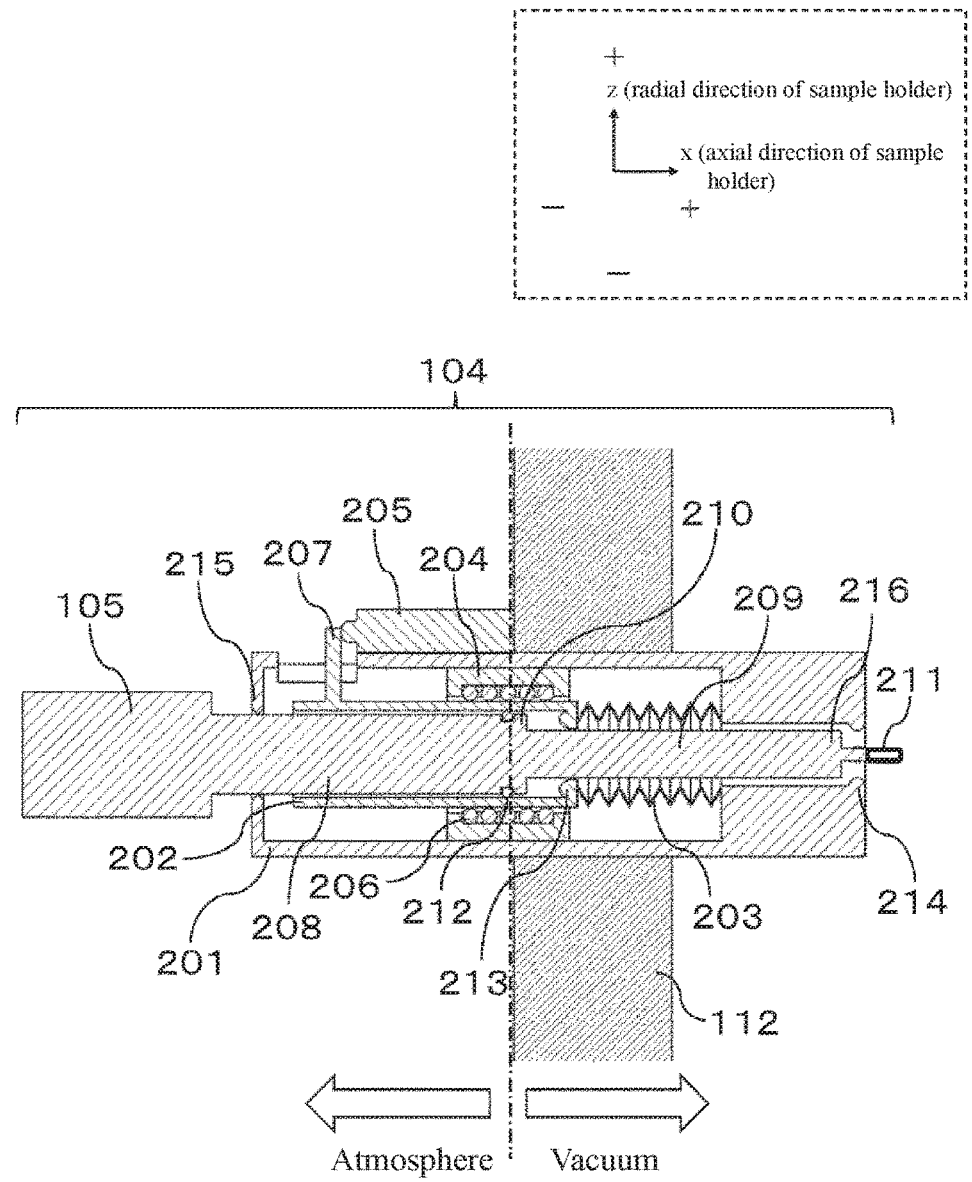
FIG. 2 is a view illustrating a cross-section in an x-z plane when a sample holder is inserted into a sample stage according to the present embodiment (first embodiment).
Figure 3:
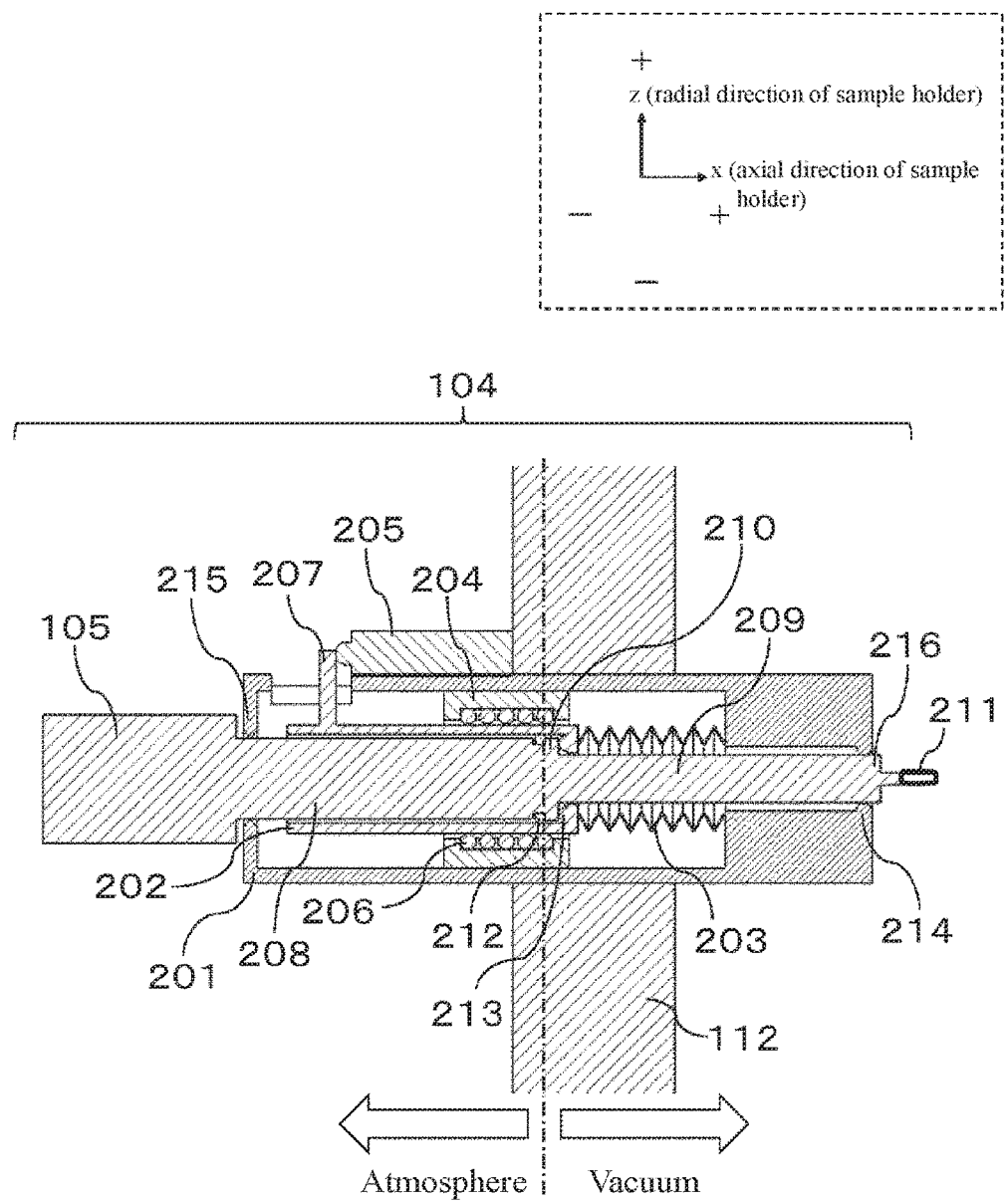
FIG. 3 is a view illustrating a cross-section in an x-z plane in a state where a sample holder is inserted into a sample stage according to the present embodiment (first embodiment).
Figure 4:
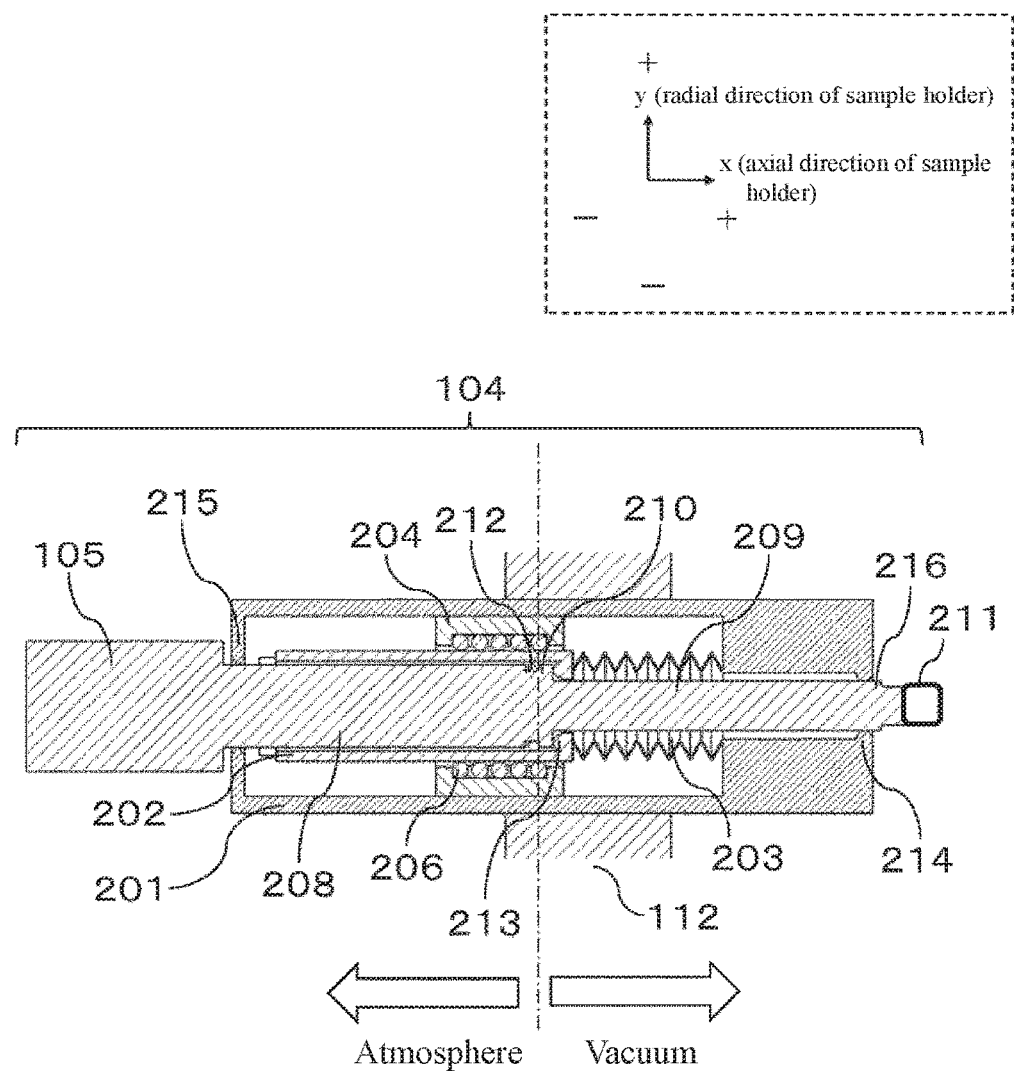
FIG. 4 is a view illustrating a cross-section in an x-y plane in a state where a sample holder is inserted into a sample stage according to the present embodiment (first embodiment).

Next, a configuration and operation of the sample stage and the sample holder according to the present embodiment are described in conjunction with FIGS. 2 to 4.

FIG. 2 is a view illustrating a cross-section in an x-z plane when the sample holder is inserted into the sample stage according to the present embodiment.

The sample stage 104 is mainly comprised of an outer cylinder 201, a cylindrical member 202, a bellows 203, a guide portion 204, and an actuator 205. The cylindrical member 202 includes a holder axial support portion 213 and an actuator axial support portion 207, which will be described later. The guide portion (linear-motion bearing portion) 204 fixed to the outer cylinder 201 supports the cylindrical member 202 in a radial direction of the sample holder 105 together with the ball member 206, which is rotationally movable in an axial direction of the sample holder 105. The bellows 203 connects the outer cylinder 201 and the cylindrical member 202 in an axial direction of the sample holder 105 in an airtight manner. The actuator 205 is arranged on the outer cylinder 201 and is arranged to closely attach to the actuator axial support portion 207 of the cylindrical member 202.

The sample holder 105 is mainly comprised of a large-diameter portion 208, a small-diameter portion 209, a first step portion 210, a second step portion 216, the holder end portion 105a, and the sample base 211. An elastic body 212 is provided in the vicinity of the first step portion 210. The elastic body 212 is arranged between the sample holder 105 and an inner wall of the cylindrical member 202. Examples of the elastic body 212 include an O-ring formed of a material, e.g., rubber, which is foamed to provide airtightness as well as stiffness in a radial direction of the sample holder 105. The holder end portion 105a indicates a region located on the sample base 211 side from the second step portion 216, and the small-diameter portion 209 indicates a region located between the first step portion 210 and the second step portion 216. The large-diameter portion 208 indicates a region located on a root side from the first step portion 210, i.e., opposite the sample base 211 side. The sample holder 105 is inserted with the elastic body 212 contacting an inner wall of the cylindrical member 202 of the sample stage 104, and is moved to a position where the first step portion 210 of the sample holder 105 comes into contact with the holder axial support portion 213 of the cylindrical member 202. The sample holder 105 inserted has two ends, which are supported by a holder end support portion 214 and a holder root support portion 215 of the outer cylinder 201, respectively.

In a state being inserted into the sample stage 104, the sample holder 105 is on a boundary indicated by the dotted line in the drawing, specifically such that the holder end portion 105a side from the elastic body 212 is vacuum and the opposite side is exposed to the atmosphere. The sample holder 105 is subjected to a force that is proportional to an area of the large-diameter portion 208 and moves the holder axial support portion 213 in a +x direction indicated in the upper right graph of the drawing. The actuator 205 moves and supports the cylindrical member 202 in an axial direction via an axial reception portion 207. Thus, the first step portion 210 is closely attached and supported by a force that is generated with respect to the holder axial support portion 213 and acts in an axial direction of the sample holder 105. Furthermore, the holder axial support portion 213 and the first step portion 210 generate a frictional force in a radial direction because of a force (normal reaction) acting in an axial direction of the sample holder 105. Therefore, in a state where the sample 106 is observed at rest in a charged particle beam apparatus, the holder axial support portion 213 and the first step portion 210 are fixed by the frictional force and no slipping occurs in a radial direction. When the sample 106 is set in an illumination position of the electron beam 102 as illustrated in FIG. 3, the holder axial support portion 213 also radially supports the first step portion 210.

Next, operation in an axial direction of the sample holder 105 is described. The actuator axial support portion 207 is pressed and moved in the −x direction indicated in the upper right graph of the drawing by the operation of the actuator 205, the cylindrical member 202 is moved in the same direction, and the sample holder 105, which is supported by the axial support portion 213 of the cylindrical member 202 is also moved in the same direction. When the actuator 205 is operated in the ±x direction indicated in the upper right graph of the drawing, the sample holder 105 and the cylindrical member 202 subjected to the force in the +x direction are collectively moved in the +x direction.

FIG. 3 is a view illustrating a cross-section in an x-z plane in a state where the sample holder is inserted into the sample stage according to the present embodiment. In addition, FIG. 4 is a view illustrating a cross-section in an x-y plane in a state where the sample holder is inserted into the sample stage according to the present embodiment. When the actuator 205 is operated in the −x direction of the upper right of the drawing to move the position of the sample 106, the cylindrical member 202 is pressed in the same direction and is subjected to a force couple around a y direction. At this time, the guide portion 204 supports the outer circumference of the cylindrical member 202 with the ball member 206 formed around in the x direction twice or more (fifth in the present drawing) to prevent the rotation of the cylindrical member 202 along the y direction. With the above configuration, the sample holder 105, which moves together with the cylindrical member 202, can also be prevented from rotating along the y direction.

<Reduction in displacement amplitude>

Next, a reduction in displacement amplitude in a radial direction of the sample holder by means of the configurations of the sample stage and the sample holder described above is described in conjunction with FIG. 9.

Figure 9:
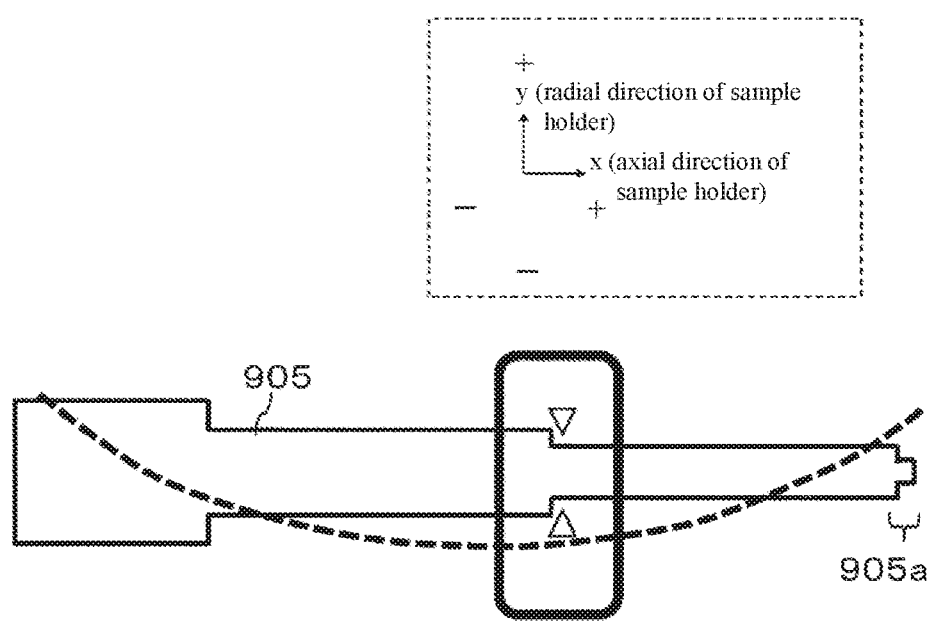
FIG. 9 is a view describing displacement amplitude in a radial direction of a side-entry sample holder.

FIG. 9 is a view describing displacement amplitude in a radial direction of a side-entry sample holder.

In the case of a side-entry sample stage into which a sample holder 905 is inserted from an atmospheric side into a vacuum, it is required that a sample be arranged at an end of the sample holder 905 and a sample base placed on a holder end portion 905a of the sample holder 905 be moved to and set at an illumination position of an electron beam. Because the interior of the charged particle beam apparatus is in a vacuum state, it is required to have a small airtight area so that the sample base reaches a central position of a TEM column, which is an illumination position of the electron beam, from the outside of the charged particle beam apparatus. Therefore, the sample holder 905 is desirably formed in a long rod-like shape. For this reason, the sample holder 905, which is formed to have a rod-like shape, tends to displace in a radial direction as illustrated in FIG. 9, resulting in an increase in amplitude of the displacement. Therefore, in order to reduce the displacement amplitude at both ends for stable positioning of the sample, support is preferably provided in the vicinity of both ends. Displacement amplitude refers to a width obtained when the sample holder 905 is displaced in a radial direction.

However, it has been revealed by results of research by the inventors that, when the sample holder 905 has a long axial length, even a structure that supports both ends increases the displacement amplitude.

Therefore, in the present embodiment, as described in FIGS. 2 to 4, the guide portion 204 is fixedly arranged between the outer cylinder 201 and the cylindrical member 202. The guide portion 204 supports the cylindrical member 202 in a radial direction of the sample holder 105 via the ball member 206. The guide portion 204 is desirably positioned in the vicinity of the holder axial support portion 213 of the cylindrical member 202. When the sample holder 105 is inserted into the sample stage 104 and the sample 106 is moved to an illumination position of the electron beam 102, the holder axial support portion 213 of the cylindrical member 202 and the first step portion 210 of the sample holder 105 are arranged in a contact state in an axial direction. At this time, a frictional force is generated between the holder axial support portion 213 and the first step portion 210. Therefore, slipping does not occur in a radial direction of the sample holder 105, enabling stable support.

Furthermore, at this time, the position of the sample holder 105 in a radial direction is determined by the holder end support portion 214 and the holder root support portion 215. As described above, the frictional force generated due to the contact between the holder axial support portion 213 and the first step portion 210 also enables a reduction in misalignment.

According to the present embodiment, the axial support portion 213 has an annular structure to evenly contact the first step portion 210. However, other than the above, for example, a plurality of projection structures having a roughly hemispherical shape may be arranged. When the sample base 211 is moved in the x and y directions in a state where the sample 106 on the sample base 211 is illuminated with the electron beam 102 of the charged particle beam apparatus in the z direction indicated in the upper right graphs of FIGS. 2 and 3, disturbance tends to occur in a resulting image. Therefore, when the projection structures are provided, the projection structures are desirably arranged on the holder axial support portion 213 at symmetrical intervals relative to an axial direction of the sample holder 105. Furthermore, in the present embodiment, a protrusion portion is provided on the holder axial support portion 213; however, a protrusion portion may be provided on the first step portion 210 side.

In addition, in the aforementioned form, the first step portion 210 of the sample holder 105 is provided at a roughly middle position in an axial direction. When both ends are supported in the structure in which the sample holder 105 is formed in a rod shape, the displacement amplitude tends to increase at a roughly middle position in an axial direction. Therefore, the sample holder 105 is desirably supported at a roughly middle position in an axial direction. However, the sample holder 105 may be supported at a different position in an axial direction between both ends. Such a configuration can also reduce oscillations in a radial direction of the sample holder 105.

In addition, the present embodiment describes a case where the material of the holder axial support portion 213 is the same as the material of the cylindrical member 202. However, a hard material, e.g., sapphire, may be used. In that case, the material of the first step portion 210 of the sample holder 105 may be titanium or the like to have an increased friction coefficient. Therefore, even when an exciting force on the sample holder 105 is increased, the axial support portion 213 can stably support the first step portion 210.

In addition, when the axial support portion 213 includes the protrusion structures with respect to the first step portion 210, contact with the protrusion structures can deform the first step portion 210. In that case, the axial support portion 213 has a plane surface or, as will be described later in the second embodiment, the first step portion 210 includes a recessed structure. Thus, when the axial support portion 213 and the first step portion 210 contact to be closely attached in an axial direction, the first step portion 210 is not deformed and a frictional force is generated between the first step portion 210 and the cylindrical member 202, so that the sample holder 105 can be maintained in a state where slipping hardly occurs in a radial direction. Thus, the sample holder 105 can be stably supported axially and radially without deformation of the first step portion 210 by the axial support portion 213.

<Reduction in sample drift>

Sample drift is a phenomenon that the position of the sample base 211 or the illumination position of the electron beam 102 on the sample 106 varies with various factors including deformation of a component of the charged particle beam apparatus and temperature changes. In the case of the side-entry sample stage 104, when a component, e.g., the elastic body 212, is deformed by the movement of the sample holder 105, a restoring force is generated to restore from the deformation, resulting in sample drift. In the present embodiment, since the sample holder 105 and the cylindrical member 202 can be moved collectively, the elastic body 212 is not deformed, and sample drift can be reduced in addition to the reduction in displacement amplitude described above.

Second Embodiment

Figure 5:
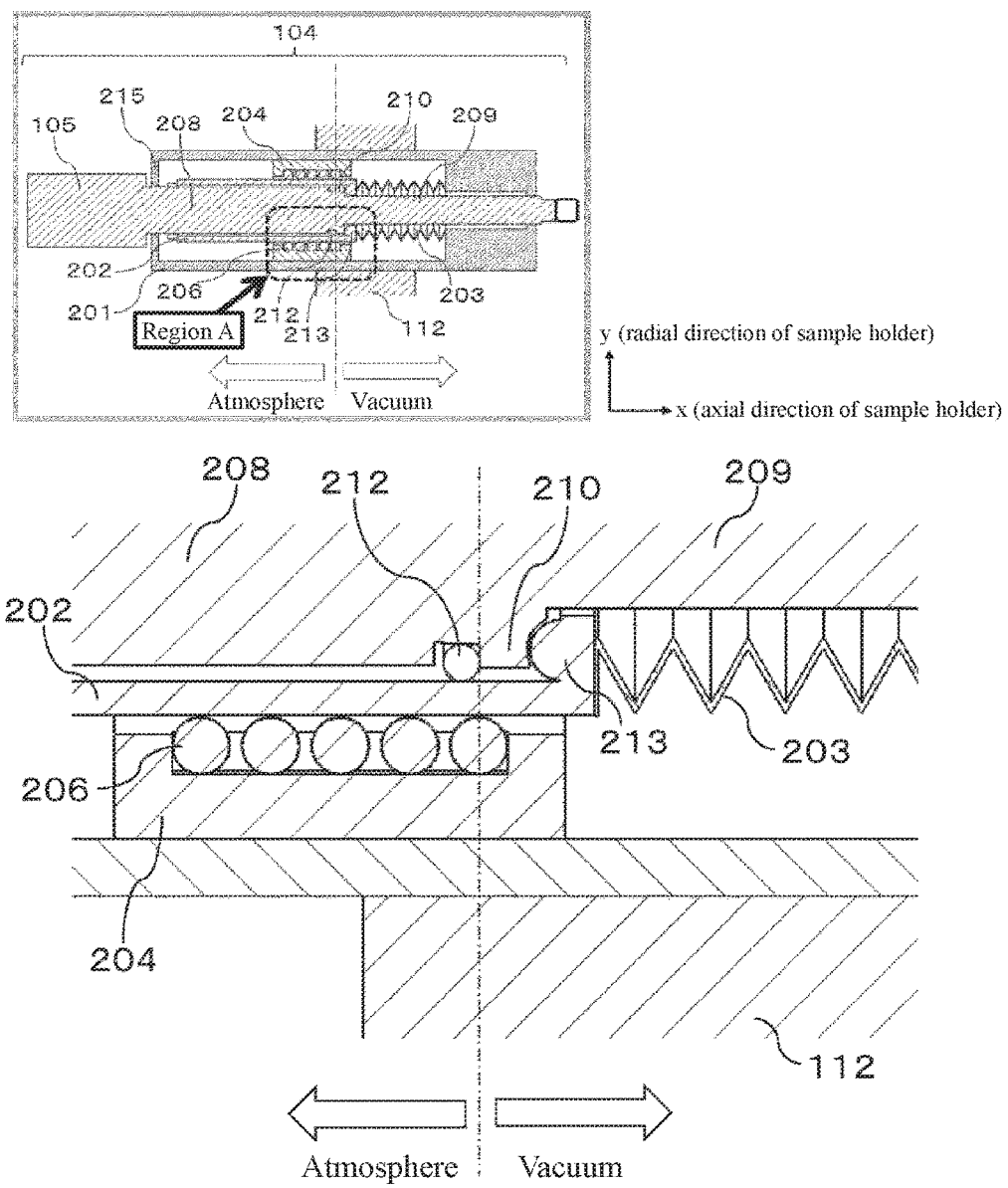
FIG. 5 is a view illustrating an enlarged cross-section in an x-y plane of an axial support portion of a sample holder and a first step portion of a sample stage according to the present embodiment (second embodiment).

In the present embodiment, a structure in which the holder axial support portion 213 of the cylindrical member 202 of the sample stage 104 and the first step portion 210 of the sample holder 105 are fit by means of a recess and a protrusion is described in conjunction with FIG. 5.

FIG. 5 is a view illustrating an enlarged cross-section in an x-y plane of the first step portion 210 of the sample stage according to the present embodiment. It is an enlarged view of Region A of the sample holder 105 indicated by the dotted line indicated at the upper left of the drawing. The present configuration is different in that the first step portion 210 of the sample holder 105 indicated in the first embodiment is further formed with a recessed portion. For the other configurations having the same functions as the configurations described above in the first embodiment, the description may be omitted. The sample holder 105 is subjected to a force in the +x direction, and then the first step portion 210, which forms the recessed portion, and the cylindrical member 202 are closely attached in an axial direction of the sample holder 105. At this time, the first step portion 210, which forms the recessed portion, and the axial support portion 213, which forms the protrusion portion, are configured to engage with each other, and have a portion at which they contact with each other in a radial direction in addition to an axial direction of the sample holder 105. Therefore, the sample holder 105 is stably supported at the holder axial support portion 213. Thus, the fitting between the recessed portion, which is formed on the first step portion 210, and the protrusion portion, which is formed on the holder axial support portion 213, increases the contact area in a radial direction of the sample holder 105, thereby enabling an increase in contact stiffness. Therefore, even when a force greater than the frictional force generated between the recessed portion, which is formed on the first step portion 210, and the protrusion portion, which is formed on the axial support portion 213, is applied, a state in which they do not slip with respect to each other in a radial direction of the sample holder 105 can be maintained.

Third Embodiment

Figure 6:
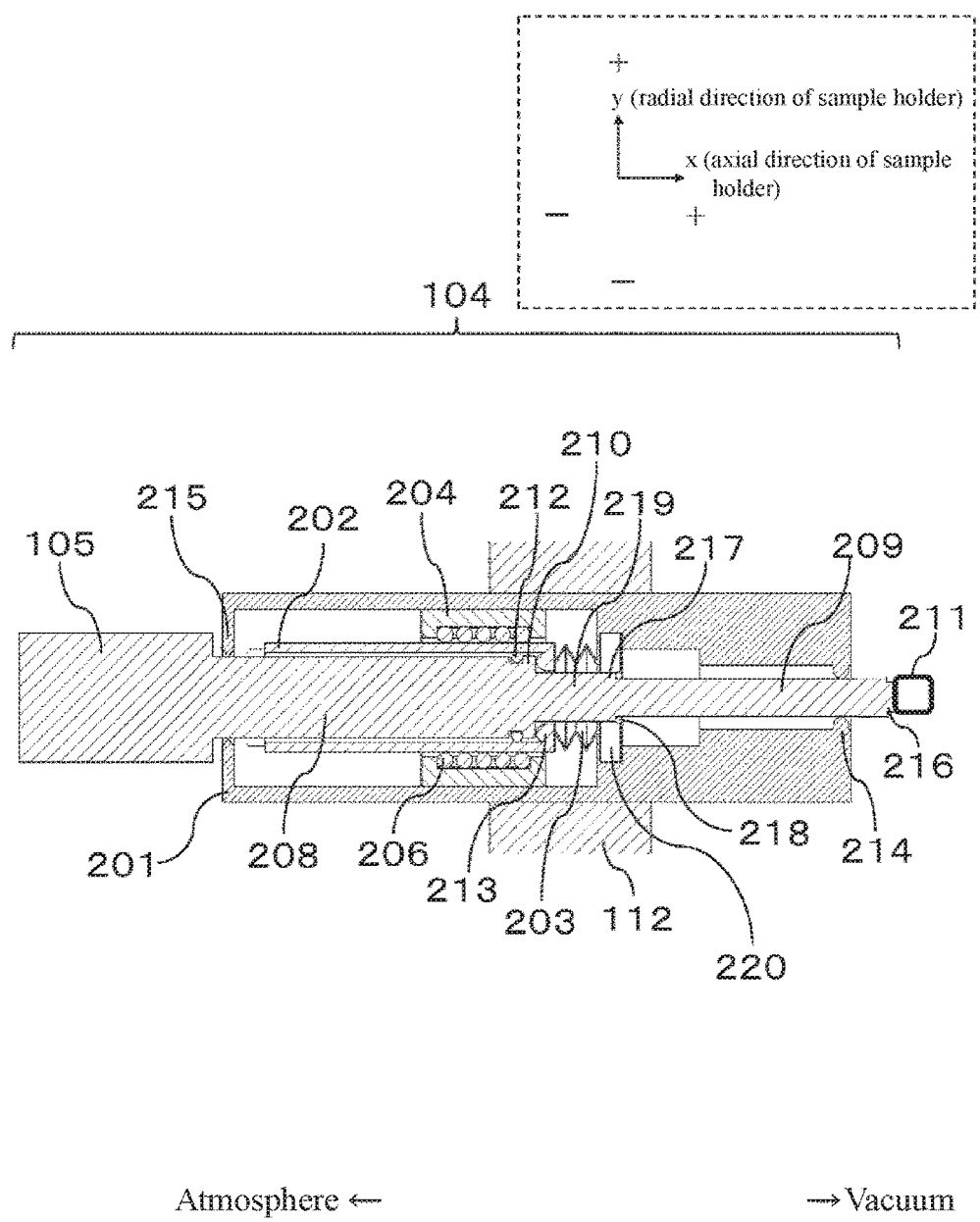
FIG. 6 is a view illustrating a cross-section in an x-y plane in a state where a sample holder is inserted into a sample stage according to the present embodiment (third embodiment).

The present embodiment describes a structure in conjunction with FIG. 6 in which, in addition to the aforementioned configuration, the sample stage 104 further includes a second holder axial support portion 218 and the sample holder 105 further includes a third step portion 217. As described above, the present configuration is different in that the sample holder 105 indicated in the first embodiment further includes the third step portion 217 and the sample stage 104 includes the second holder axial support portion 218.

For the other configurations having the same functions as the configurations described above in the first embodiment, the description may be omitted.

The sample holder 105 is mainly comprised of the large-diameter portion 208, a middle-diameter portion 219, the small-diameter portion 209, the holder end portion 105a, the sample base 211, the first step portion 210, the second step portion 216, and the third step portion 217. An elastic member 220 is provided in the vicinity of the third step portion 217. The elastic member 220 has a disk shape.

As described above, when the sample holder 105 is inserted into the sample stage 104, because the interior of the charged particle beam apparatus is in a vacuum state, the sample holder 105 is subjected to a force in the +x direction, and the first step portion 210 and the axial support portion 213 of the cylindrical member 202 are closely attached and hardly slip in a radial direction because of the frictional force, so that the sample holder 105 is stably supported axially and radially.

The outer cylinder 201 of the sample stage 104 includes the second holder axial support portion 218 and the elastic member 220. The second holder axial support portion 218 is arranged at an end of the elastic member 220. During insertion into the sample stage 104, when the sample holder 105 is subjected to a force in the +x direction, the third step portion 217 and the second holder axial support portion 218 contact in a closely attached manner.

The elastic member 220 is formed of a structure having a low stiffness in an axial direction of the sample holder 105 and has a high stiffness in a radial direction, e.g., rubber. The sample holder 105 hardly slips in a radial direction because of the frictional force, enabling more stable support.

Next, operation in an axial direction of the sample holder 105 is described. When the cylindrical member 202 is moved in the −x direction by the operation of the actuator 205, the sample holder 105 supported by the cylindrical member 202 is also moved in the same −x direction together. The elastic member 220, when inserted, is arranged to generate a force in the −x direction. The second holder axial support portion 218, which is arranged at an end of the elastic member 220, follows the sample holder 105 and is moved in a state being closely attached to the third step portion 217.

When the actuator 205 is operated in the +x direction, because the interior of the charged particle beam apparatus is in a vacuum state, the sample holder 105 subjected to a force in the +x direction is moved in the +x direction together with the cylindrical member 202. At this time, even when the sample holder 105 is moved in the +x direction, because a reaction force generated by the deformation of the elastic member 220 is small, the second holder axial support portion 218 follows the motion of the sample holder 105 and is moved while being closely attached to the third step portion 217.

With the configuration described above, the sample holder 105 can be supported in a radial direction with a higher stiffness than that of the case where the number of axial support portion is one, enabling a more effective reduction in displacement amplitude of the sample holder 105. In the present embodiment, the configuration including two axial support portions is described. However, three or more axial support portions may be provided. The present embodiments are not limited to the aforementioned configurations, but various variations may be included. For example, the aforementioned embodiments are described in detail for the sake of comprehensible description and are not necessarily limited to include all the described configurations. In addition, a part of the configuration of a certain embodiment may be replaced with a configuration of a different embodiment, and a configuration of a different embodiment may be added to the configuration of a certain embodiment. In addition, a different configuration may be added, deleted, or replaced with respect to a part of the configurations of the embodiments.

REFERENCE SIGNS LIST

100 TEM body
101 electron gun
102 electron beam
103 illumination lens
104 sample stage
105, 905 sample holder
105a, 905a holder end portion
106 sample
107 objective lens
108 projection lens
109 detector
110 controller
111 sample chamber
112 column
201 outer cylinder
202 cylindrical member
203 bellows
204 guide portion
205 actuator
206 ball member
207 actuator axial support portion
208 large-diameter portion
209 small-diameter portion
210 first step portion
211 sample base
212 elastic body
213 holder axial support portion
214 holder end support portion
215 holder root support portion
216 second step portion
217 third step portion
218 second axial support portion
219 middle-diameter portion
220 elastic member

The invention claimed is:

1. A charged particle beam apparatus comprising:
a sample holder configured to hold a sample; and
a sample stage into which the sample holder is introduced,
wherein
the sample holder includes:
  a shaft portion configured to hold a sample base on which a sample is placed on one end portion;
  a step portion configured to he formed in a radial direction of the shaft portion; and
  an elastic body configured to be arranged in a vicinity of the step portion, the sample stage includes:
  a cylindrical portion configured to be capable of accommodation of a part of the shaft portion;
  an outer cylindrical portion configured to accommodate the cylindrical portion; and
  a guide portion configured to be arranged between the cylindrical portion and the outer cylindrical portion, the guide portion including a ball member configured to be capable of rotation in an axial direction of the shaft portion, the guide portion supporting the cylindrical portion in the radial direction of the shaft portion,
the cylindrical portion forms a support portion configured to contact the step portion when the sample holder is inserted, and
contact between the step portion and a support portion generates a frictional force in the radial direction of the shaft portion relative to the sample holder.

2. The charged particle beam apparatus according to claim 1,
wherein the step portion includes a recessed structure and the support portion includes a protrusion structure, so that they are formed to fit to each other.

3. The charged particle beam apparatus according to claim 1,
wherein the step portion includes a protrusion structure and the support portion includes a recessed structure, so that they are formed to fit to each other.

4. The charged particle beam apparatus according to claim 1,
wherein the sample holder includes:
apart from the step portion configured to be formed in a radial direction of the shaft portion, a second step portion configured to be formed on a side of the sample base from the step portion and in the radial direction of the shaft portion, and
the sample stage includes:
a second support portion configured to contact the second step portion when the sample holder is inserted.

5. The charged particle beam apparatus according to claim 1, wherein the support portion is formed of sapphire.

6. The charged particle beam apparatus according to claim 1, wherein the guide portion includes two or more rows of ball members configured to be arranged parallel to an axial direction of a shaft portion of the sample holder.

7. The charged particle beam apparatus according to claim 1, wherein a side of the sample base from a contact portion between the support portion and the step portion is maintained in a vacuum state.

8. A sample stage for a charged particle beam apparatus into which a sample holder configured to hold a sample is introduced, the sample holder comprising:
a shaft portion configured to hold a sample base on which a sample is placed on one end portion;
a step portion configured to be formed in a radial direction of the shaft portion; and
an elastic body configured to be arranged in a. vicinity of the step portion,
the sample stage comprising:
a cylindrical portion configured to be capable of accommodation of a part of the shaft portion;
an outer cylindrical portion configured to accommodate the cylindrical portion; and
a guide portion configured to be arranged between the cylindrical portion and the outer cylindrical portion, the guide portion including a ball member configured to be capable of rotation in an axial direction of the shaft portion, the guide portion supporting the cylindrical portion in the radial direction of the shaft portion,
wherein
the cylindrical portion forms a support portion configured to contact the step portion when the sample holder is inserted, and contact between the step portion and a support portion generates a frictional force in the radial direction of the shaft portion relative to the sample holder.

* * * * *